United States Patent
Okuyama et al.

(10) Patent No.: US 7,682,463 B2
(45) Date of Patent: Mar. 23, 2010

(54) RESIST STRIPPING METHOD AND RESIST STRIPPING APPARATUS

(75) Inventors: Atsushi Okuyama, Shinagawa-ku (JP); Kazumi Asada, Shinagawa-ku (JP); Yoshio Okamoto, Kamikyo-ku (JP); Yuji Sugahara, Kamikyo-ku (JP)

(73) Assignee: Dainippon Screen Mfg. Co., Ltd. (JP)

( * ) Notice: Subject to any disclaimer, the term of this patent is extended or adjusted under 35 U.S.C. 154(b) by 759 days.

(21) Appl. No.: 11/080,878

(22) Filed: Mar. 15, 2005

(65) Prior Publication Data

US 2005/0205115 A1 Sep. 22, 2005

(30) Foreign Application Priority Data

Mar. 16, 2004 (JP) .............................. 2004-074814

(51) Int. Cl.
*B08B 7/00* (2006.01)
*B08B 3/04* (2006.01)

(52) U.S. Cl. .............................. 134/34; 134/32; 134/33; 134/38; 134/902

(58) Field of Classification Search ............ 134/3, 134/41, 33, 1.3, 2, 32, 34, 38, 40, 902
See application file for complete search history.

(56) References Cited

U.S. PATENT DOCUMENTS

| | | | |
|---|---|---|---|
| 5,634,980 A | | 6/1997 | Tomita et al. |
| 5,740,488 A | * | 4/1998 | Fujimoto ................... 396/604 |
| 6,000,862 A | * | 12/1999 | Okuda et al. ................ 396/579 |
| 6,159,662 A | * | 12/2000 | Chen et al. .................. 430/313 |
| 6,248,175 B1 | * | 6/2001 | Subramanian et al. ...... 118/712 |
| 6,382,849 B1 | * | 5/2002 | Sakamoto et al. ........... 396/611 |
| 6,649,525 B1 | * | 11/2003 | Phan et al. .................. 438/694 |
| 6,743,301 B2 | * | 6/2004 | Matsuno et al. ............... 134/26 |
| 2002/0053355 A1 | | 5/2002 | Kamikawa et al. |
| 2003/0159719 A1 | * | 8/2003 | Ito et al. ....................... 134/33 |
| 2003/0196986 A1 | * | 10/2003 | Tsung-Kuei et al. ........... 216/2 |
| 2004/0000322 A1 | * | 1/2004 | Verhaverbeke .............. 134/1.3 |
| 2004/0043329 A1 | * | 3/2004 | Wu et al. ..................... 430/311 |
| 2007/0045231 A1 | * | 3/2007 | Wada ............................ 216/83 |

FOREIGN PATENT DOCUMENTS

| | | |
|---|---|---|
| JP | 1-179321 | 7/1989 |
| JP | 6-291098 | 10/1994 |
| JP | 7-263302 | 10/1995 |
| JP | 9-213616 | 8/1997 |
| JP | 2002-28588 | 1/2002 |

OTHER PUBLICATIONS

Office Action issued Apr. 23, 2009 in connection with corresponding Japanese Patent Application No. 2004-074814.

* cited by examiner

*Primary Examiner*—Alexander Markoff
(74) *Attorney, Agent, or Firm*—Ostrolenk Faber LLP

(57) ABSTRACT

After the resist stripping liquid is supplied to the surface of the substrate which is being rotated at a first rotational speed, the rotational speed of the substrate is reduced from the first rotational speed to a second rotational speed with the supply of the resist stripping liquid to the surface of the substrate continued, thereby forming a liquid film by a mount of the resist stripping liquid on the surface of the substrate and then, maintaining a state where the liquid film is formed.

4 Claims, 3 Drawing Sheets

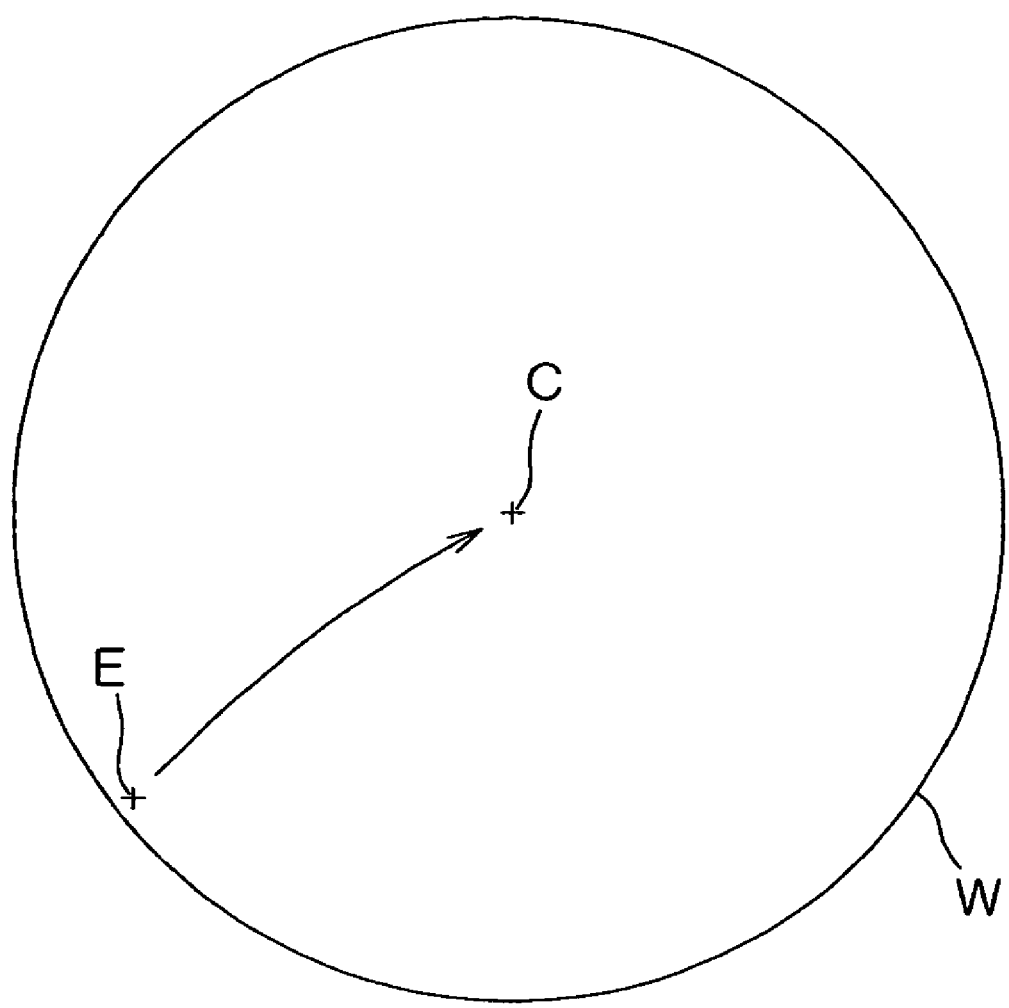

RESIST STRIPPING METHOD AND RESIST STRIPPING APPARATUS

BACKGROUND OF THE INVENTION

1. Field of the Invention

The present invention relates to a resist stripping method and a resist stripping apparatus for stripping away an unnecessary resist from surfaces of various types of substrates such as a semiconductor wafer, a glass substrate for a liquid crystal display device, a glass substrate for a plasma display, a substrate for an optical disk, a substrate for a magnetic disk, a substrate for a magneto-optical disk, and a substrate for a photomask.

2. Description of Related Art

In the steps of fabricating semiconductor devices and liquid crystal display devices, processing (resist stripping processing) for stripping an unnecessary resist from surfaces of substrates such as semiconductor wafers and glass substrates for liquid crystal display panels, for example, is performed. As types of the resist stripping processing, batch processing for collectively processing a plurality of substrates has conventionally prevailed. However, in recent years, as the substrate to be processed increases in size, single substrate processing for processing substrates one at a time by supplying a resist stripping liquid to a surface of the substrate has been paid attention to.

A conventional single substrate processing apparatus for performing resist stripping processing comprises a spin chuck for holding and rotating a substrate almost horizontally and a nozzle for supplying a resist stripping liquid to a surface (an upper surface) of the substrate held by the spin chuck. In the resist stripping processing, while the substrate is being rotated at a rotational speed of approximately 10 rpm by the spin chuck, the resist stripping liquid is supplied from the nozzle to the vicinity of the rotation center on a surface of the substrate which is being rotated. The resist stripping liquid supplied to the surface of the substrate receives a centrifugal force produced by the rotation of the substrate, to flow while being enlarged toward a peripheral edge of the substrate from the vicinity of the rotation center which is the position where the resist stripping liquid is supplied. Thus, the resist stripping liquid spreads over the entire area on the surface of the substrate, so that the resist stripping processing for the surface of the substrate is achieved.

Since the rotational speed of the substrate at the time of supplying the resist stripping liquid is low, however, it takes time for the resist stripping liquid to spread over the entire area on the surface of the substrate and it takes long to require the resist stripping processing (processing throughput is low).

Since the resist stripping liquid supplied to the center on the surface of the substrate flows while reacting with a resist on the surface of the substrate, the processing capability is gradually degraded until it reaches a peripheral portion of the substrate. The resist at the peripheral portion on the surface of the substrate is not patterned and is formed in a thick film state. In the resist stripping liquid whose processing capability is degraded, therefore, the resist at the peripheral portion of the substrate cannot be completely stripped.

SUMMARY OF THE INVENTION

An object of the present invention is to provide a resist stripping method and a resist stripping apparatus capable of shortening a processing time period as well as improving the performance of stripping the resist.

Another object of the present invention is to provide a resist stripping method and a resist stripping apparatus capable of also completely removing a resist formed in a thick film state at a peripheral portion on a surface of a substrate.

A resist stripping method according to an aspect of the present invention is a method for stripping a resist formed on a surface of a substrate using a resist stripping liquid produced by mixing a sulfuric acid and a hydrogen peroxide solution, comprising a substrate holding step for holding a substrate to be processed with its surface directed upward by a substrate holding mechanism; a substrate rotating step for rotating the substrate held by the substrate holding mechanism around an axis crossing its surface; a resist stripping liquid supplying step for supplying a resist stripping liquid to the surface of the substrate during the substrate rotating step; a speed reducing step for reducing the rotational speed of the substrate from a first rotational speed to a second rotational speed lower than the first rotational speed during the resist stripping liquid supplying step; and a paddling step for maintaining a liquid film formed by a mount of the resist stripping liquid on the surface of the substrate after the speed reducing step.

According to the method, in a state where the substrate is being rotated at the first rotational speed, the resist stripping liquid is supplied to the surface of the substrate which is being rotated, and the rotational speed of the substrate is then reduced from the first rotational speed to the second rotational speed lower than the first rotational speed with the supply of the resist stripping liquid to the surface of the substrate continued.

The resist stripping liquid supplied to the surface of the substrate which is being rotated at the first rotational speed receives a relatively large centrifugal force produced by the rotation at the first rotational speed, and flows at a relatively high flow rate radially outward in rotation from the supply position on the surface of the substrate. If the resist stripping liquid is supplied to the center (the vicinity of a rotation center) on the surface of the substrate, therefore, the resist stripping liquid quickly spreads over the entire area on the surface of the substrate. Thus, a time period during which the resist stripping liquid is supplied to the surface of the substrate can be shortened, and a processing time period can be shortened by the shortened time period.

The resist stripping liquid flows at a high flow rate on the surface of the substrate while being supplied to the surface of the substrate, so that the reacted resist stripping liquid which contributes to the processing is quickly replaced with an unreacted resist stripping liquid which does not contribute to the processing over the entire area on the surface of the substrate. Therefore, the entire area on the surface of the substrate can be always subjected to processing using a new unreacted resist stripping liquid. Thus, the performance of stripping the resist on the surface of the substrate (the resist stripping performance) can be significantly improved.

Furthermore, the paddling step is carried out after the rotational speed of the substrate is reduced, so that the state where the liquid film by a mount of the resist stripping liquid is formed over the entire area on the surface of the substrate is satisfactorily maintained. This allows the resist and the resist stripping liquid to be sufficiently reacted with each other over the entire area on the surface of the substrate while minimizing the consumption of the resist stripping liquid. Even if the resist is a relatively tough resist (e.g., a resist used for high-concentration ion implantation), therefore, the resist can be completely stripped from the surface of the substrate.

Furthermore, when the resist stripping liquid is supplied to the center on the surface of the substrate, the resist is stripped from the entire area on the surface of the substrate prior to forming the liquid film of the resist stripping liquid. Alternatively, even if the resist remains on the surface of the substrate, the resist remaining on the surface of the substrate enters a state where it is easily stripped from the substrate. Even if a time period required for the paddling step is set short, therefore, the remaining resist can be completely stripped. Therefore, good resist stripping processing can be achieved in a shorter processing time period than that in the conventional resist stripping processing by setting the time period required for the puddle step short.

It is preferable that the resist stripping method further comprises a supply position moving step for moving the position where the resist stripping liquid is supplied on the surface of the substrate from the peripheral portion to the center during the resist stripping liquid supplying step.

In this case, after the resist stripping liquid is supplied to the peripheral portion on the surface of the substrate, the position where the resist stripping liquid is supplied is moved, so that the resist stripping liquid is supplied to the center on the surface of the substrate.

The resist stripping liquid is supplied to the peripheral portion on the surface of the substrate, so that the resist formed in a thick film state at the peripheral portion on the surface of the substrate can be intensively subjected to processing using the resist stripping liquid. The resist stripping liquid supplied to the center on the surface of the substrate flows from the supply position (the center on the surface) to the peripheral portion on the surface of the substrate. Therefore, the peripheral portion on the surface of the substrate is also subjected to the processing using the resist stripping liquid at this time. This allows the resist formed in a thick film state at the peripheral portion on the surface of the substrate to be satisfactorily stripped. As a result, the resist can be completely stripped from the entire area on the surface of the substrate.

Furthermore, in the supply position moving step, even if the movement of the supply position is stopped only for a predetermined time period at the peripheral portion on the surface of the substrate, and the supply position is then moved from the peripheral portion to the center, the resist at the peripheral portion on the surface of the substrate can be satisfactorily stripped.

Even if the resist stripping liquid is supplied to the center on the surface of the substrate, and is then supplied to the peripheral portion on the surface of the substrate by moving the position where the resist stripping liquid is supplied, the resist formed in a thick film state at the peripheral portion on the surface of the substrate can be satisfactorily stripped. In the case, however, the resist stripping liquid is not supplied to the center on the surface of the substrate while being supplied to the peripheral portion on the surface. Therefore, the resist stripping liquid adhering to the center on the surface of the substrate is dried during that period, so that contamination of the substrate (a drying trace of the resist striping liquid, generation of particles by deposition of a component of the resist stripping liquid, etc.) by the drying of the resist stripping liquid may occur. On the other hand, in a case where the resist stripping liquid is supplied to the peripheral portion on the surface of the substrate prior to being supplied to the center on the surface, the resist stripping liquid is not dried on the surface of the substrate, so that the contamination of the substrate by the drying of the resist stripping liquid may not occur.

It is preferable that the supply position moving step is carried out while the substrate is being rotated at the first rotational speed before the speed reducing step. Thus, the position where the resist stripping liquid is supplied is moved while the substrate is being rotated at the first rotational speed, so that the resist stripping liquid is supplied to the center on the surface of the substrate, thereby allowing the resist stripping liquid to quickly spread over the entire area on the surface of the substrate.

It is preferable that the resist stripping liquid supplying step is continued until a predetermined time period has elapsed since the rotational speed of the substrate was reduced to the second rotational speed after the speed reducing step. Thus, the resist stripping liquid is supplied until a predetermined time period has elapsed since the rotational speed of the substrate was reduced to the second rotational speed, thereby allowing the liquid film of the resist stripping liquid to be formed sufficiently thick over the entire area on the surface of the substrate.

The first rotational speed can be set to a rotational speed of not less than 1000 rpm, and is preferably set within a speed range of 1000 to 3000 rpm.

The second rotational speed can be set within a speed range of 0 rpm to 100 rpm.

A resist stripping apparatus according to another aspect of the present invention is a resist stripping apparatus that strips a resist formed on a surface of a substrate using a resist stripping liquid produced by mixing a sulfuric acid and a hydrogen peroxide solution, comprising a substrate holding mechanism for holding the substrate in such a posture that its surface is directed upward; a substrate rotating mechanism for rotating the substrate held by the substrate holding mechanism around an axis crossing the surface of the substrate; a resist stripping liquid supplying mechanism for supplying the resist stripping liquid to the surface of the substrate which is being rotated by the substrate rotating mechanism; a speed reduction control unit for controlling the substrate rotating mechanism while the resist stripping liquid is supplied to the surface of the substrate by the resist stripping liquid supplying mechanism, to reduce the rotational speed of the substrate which is being rotated by the substrate rotating mechanism from a first rotational speed to a second rotational speed lower than the first rotational speed; and a paddle control unit for controlling the resist stripping liquid supplying mechanism after control carried out by the speed reduction control unit, to maintain a liquid film formed by a mount of the resist stripping liquid on the surface of the substrate.

In the apparatus, in a state where the substrate is being rotated at the first rotational speed, the resist stripping liquid is supplied to the surface of the substrate which is being rotated. And the rotational speed of the substrate is then reduced from the first rotational speed to the second rotational speed lower than the first rotational speed with the supply of the resist stripping liquid to the surface of the substrate continued, to form the liquid film of the resist stripping liquid on the surface of the substrate. Thereafter, a state where the liquid film of the resist stripping liquid is formed over the entire area on the surface of the substrate is satisfactorily maintained. This allows the resist and the resist stripping liquid to be sufficiently reacted with each other over the entire area on the surface of the substrate while minimizing the consumption of the resist stripping liquid. Even if the resist is a relatively tough resist, therefore, the resist can be completely stripped from the surface of the substrate.

Furthermore, when the resist stripping liquid is supplied to the center on the surface of the substrate, the resist is stripped from the entire area on the surface of the substrate prior to forming the liquid film of the resist stripping liquid. Alternatively, even if the resist remains on the surface of the substrate, the resist remaining on the surface of the substrate enters a state where it is easily stripped from the substrate. Even if a time period during which the liquid film of the resist stripping liquid is maintained on the surface of the substrate is short, therefore, the remaining resist can be completely stripped. Therefore, good resist stripping processing can be achieved in a shorter processing time period than that in the conventional resist stripping processing by setting a time period during which the liquid film of the resist stripping liquid is maintained on the surface of the substrate short.

The resist stripping liquid supplied to the surface of the substrate which is being rotated at the first rotational speed receives a relatively large centrifugal force produced by the rotation at the first rotational speed, and flows at a relatively high flow rate radially outward in rotation from the supply position on the surface of the substrate. If the resist stripping liquid is supplied to the center (the vicinity of a rotation center) on the surface of the substrate, therefore, the resist stripping liquid quickly spreads over the entire area on the surface of the substrate, thereby making it possible to shorten a time period during which the resist stripping liquid is supplied to the surface of the substrate and to shorten a processing time period by the shortened time period.

The resist stripping liquid flows at a high flow rate on the surface of the substrate while being supplied to the surface of the substrate, so that the reacted resist stripping liquid which contributes to the processing is quickly replaced with an unreacted resist stripping liquid which does not contribute to the processing over the entire area on the surface of the substrate. Therefore, the entire area on the surface of the substrate can be always subjected to processing using a new unreacted resist stripping liquid. Thus, the performance of stripping the resist on the surface of the substrate (the resist stripping performance) can be significantly improved.

The resist stripping liquid supplying mechanism may comprise a nozzle for discharging the resist stripping liquid toward the surface of the substrate, a resist stripping liquid supply path for supplying the resist stripping liquid to the nozzle, and a valve interposed in a halfway portion of the resist stripping liquid supply path.

In this case, it is preferable that the resist stripping apparatus further comprises a supply position moving mechanism for moving the nozzle to move the position where the resist stripping liquid is supplied on the surface of the substrate, and a supply position control unit for controlling the supply position moving mechanism while the resist stripping liquid is supplied to the surface of the substrate by the resist stripping liquid supplying mechanism, to move the position where the resist stripping liquid is supplied on the surface of the substrate from the peripheral portion to the center.

According to this configuration, after the resist stripping liquid is supplied to the peripheral portion on the surface of the substrate, the position where the resist stripping liquid is supplied is moved, so that the resist stripping liquid is supplied to the center on the surface of the substrate. The resist stripping liquid is supplied to the peripheral portion on the surface of the substrate, so that the resist formed in a thick film state at the peripheral portion on the surface of the substrate can be intensively subjected to processing using the resist stripping liquid. The resist stripping liquid supplied to the center on the surface of the substrate flows from the supply position (the center on the surface) to the peripheral portion on the surface of the substrate. Therefore, the peripheral portion on the surface of the substrate is also subjected to the processing using the resist stripping liquid at this time. This allows the resist formed in a thick film state at the peripheral portion on the surface of the substrate to be satisfactorily stripped. As a result, the resist can be completely stripped from the entire area on the surface of the substrate.

The supply position moving mechanism may comprise an arm on which the nozzle is mounted, a supporting shaft for supplying the arm, and an arm driving mechanism for rotating the supporting shaft back and forth, to swing the arm.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is an illustrative view for explaining the movement of the position where an SPM (resist stripping liquid) is supplied on a surface of a wafer.

DETAILED DESCRIPTION OF THE PREFERRED EMBODIMENTS

Figure 1:
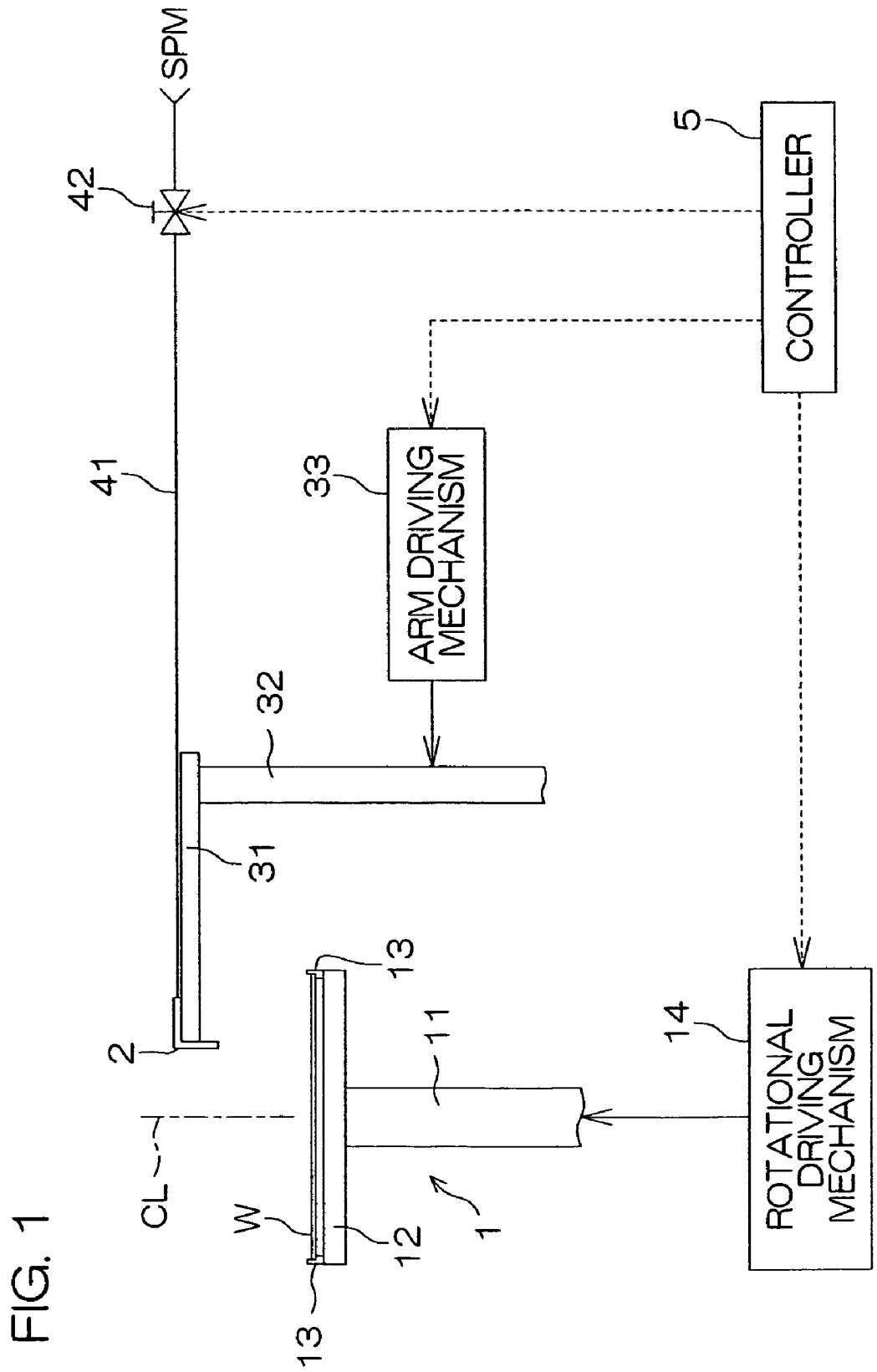
FIG. 1 is an illustrative view showing the configuration of a resist stripping apparatus according to an embodiment of the present invention.

FIG. 1 is an illustrative view showing the configuration of a resist stripping apparatus according to an embodiment of the present invention. The resist stripping apparatus is a single wafer processing apparatus for supplying a resist stripping liquid to a surface (a device formation surface) of a semiconductor wafer W (hereinafter merely referred to as a "wafer W") which is an example of a substrate and stripping away an unnecessary resist from the surface of the wafer W. The resist stripping apparatus comprises a spin chuck 1 for holding the wafer W almost horizontally and rotating the held wafer W, and an SPM nozzle 2 for supplying an SPM (sulfuric acid/hydrogen peroxide mixture) serving as the resist stripping liquid to a surface (an upper surface) of the wafer W held in the spin chuck 1.

The spin chuck 1 comprises a spin shaft 11 extending almost vertically, a spin base 12 mounted on an upper end of the spin shaft 11 almost horizontally, and a plurality of clamp members 13 provided upright on an upper surface of the spin base 12.

The plurality of clamp members 13 are arranged spaced apart from one another on a circumference corresponding to the outer shape of the wafer W. The wafer W can be held in a substantially horizontal posture by clamping an end surface of the wafer W at a plurality of different positions. The plurality of clamp members 13 are arranged on a circumference having a central axis CL of the spin shaft 11 as its center. When the wafer W is held by the plurality of clamp members 13, the center of the wafer W is positioned on the central axis CL of the spin shaft 11.

A rotational driving mechanism 14 including a driving source such as a motor is coupled to the spin shaft 11. The spin shaft 11 can be rotated around the central axis CL by inputting a rotating force to the spin shaft 11 from the rotational driving mechanism 14. Thus, the wafer W, together with the spin base 12, can be rotated around the central axis CL of the spin shaft 11 by inputting a rotating force to the spin shaft 11 from the rotational driving mechanism 14 in a state where the wafer W is held by the plurality of clamp members 13.

The spin chuck 1 is not limited to one having such a configuration. For example, another configuration of the spin chuck 1 is a vacuum suction type spin chuck (a vacuum chuck). The wafer W is held in a horizontal posture by vacuum suction of a non-device surface of the wafer W and is rotated around a vertical axis in a state where the wafer W is held.

The SPM nozzle 2 is mounted on a front end of an arm 31 extending almost horizontally above the spin chuck 1 with its discharge outlet directed downward. The arm 31 is supported on a supporting shaft 32 extending almost vertically beside the spin chuck 31. An arm driving mechanism 33 including a driving source such as a motor is coupled to the supporting shaft 32. The arm 31 can be swung within an approximately horizontal plane by inputting a driving force from the arm driving mechanism 33 to the supporting shaft 32 to rotate the supporting shaft 32 back and forth within a predetermined angle range. The swing of the arm 31 allows the SPM nozzle 2 to be arranged above a peripheral portion of the wafer W held in the spin chuck 1 or arranged above the center of the wafer W.

An SPM supply path 41 is connected to the SPM nozzle 2. An SPM which is a mixed solution of a sulfuric acid and a hydrogen peroxide solution is supplied to the SPM supply path 41. It is preferable that the SPM is obtained by mixing a sulfuric acid and a hydrogen peroxide solution at a ratio of 1 to 0.5 to 0.8, for example.

An SPM valve 42 for switching supply/stop of the SPM to the SPM nozzle 2 is interposed in a halfway portion of the SPM supply path 41.

It is preferable that a sulfuric acid and a hydrogen peroxide solution are mixed by a mixing valve and are sufficiently agitated by an agitating mechanism immediately before the SPM is supplied to the SPM supply path 41. Consequently, a chemical reaction ($H_2SO_4+H_2O_2 \rightarrow H_2SO_5+H_2O$) between the sulfuric acid and the hydrogen peroxide solution occurs, to produce an SPM containing $H_2SO_5$ having a strong oxidative force. At this time, heat (reaction heat) is generated by the chemical reaction. The liquid temperature of the SPM is raised to a temperature (e.g., 120~130° C.) higher than a temperature at which a resist formed on the surface of the wafer W can be satisfactorily stripped by the heat generation. The SPM whose temperature is raised is supplied to the SPM nozzle 2 through the SPM supply path 41, and is discharged from the discharge outlet of the SPM nozzle 2 toward the surface of the wafer W held in the spin chuck 1.

The resist stripping apparatus further comprises a controller 5 serving as a speed reduction control unit, a paddle control unit, and a supply position control unit. The controller 5 comprises a microcomputer. The controller 5 controls the operations of the rotational driving mechanism 14 and the arm driving mechanism 33. The opening/closing of the SPM valve 42 is controlled to discharge the SPM from the SPM nozzle 2 and stop the discharge of the SPM.

Figure 2:
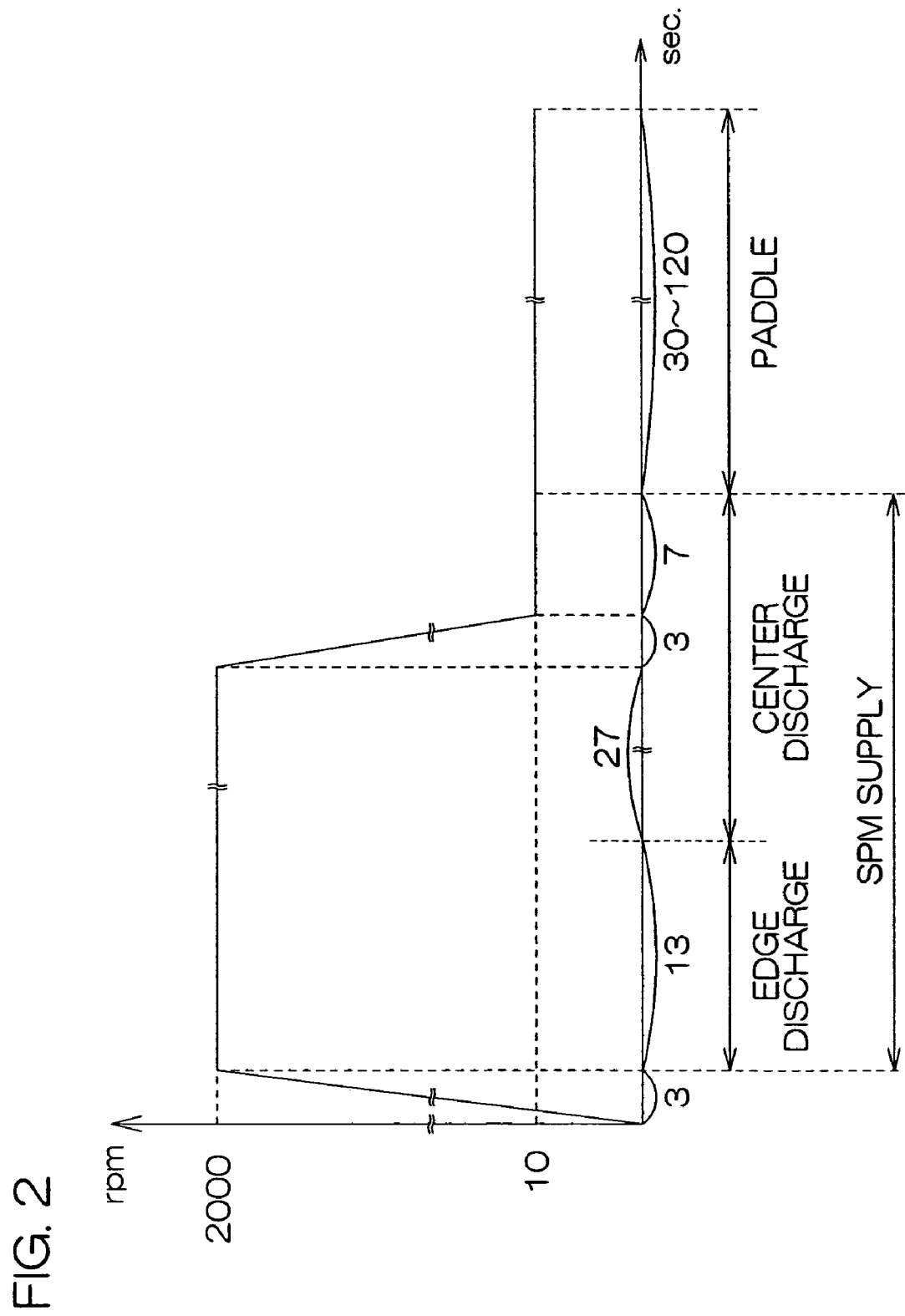
FIG. 2 is a timing chart for explaining processing in the resist stripping apparatus shown in FIG. 1.

FIG. 2 is a timing chart for explaining processing in the resist stripping apparatus (resist stripping processing). The wafer W to be processed is carried in by a transfer robot (not shown), and is held in the spin chuck 1 with a surface which is a device formation surface directed upward.

In the resist stripping processing, the rotational driving mechanism 14 is first controlled, so that the rotation of the wafer W held in the spin chuck 1 is started. Further, the arm driving mechanism 33 is controlled, so that the SPM nozzle 2 is moved upward from the peripheral portion on the surface of the wafer W.

The rotational speed of the wafer W reaches a first rotational speed (e.g., 2000 rpm) determined within a range of not less than 1000 rpm and preferably, a range of 1000 to 3000 rpm in approximately three seconds from the start of the rotation. When the rotational speed of the wafer W reaches the first rotational speed, the SPM valve 42 is opened, so that the SPM is discharged from the SPM nozzle 2 toward the peripheral portion on the surface of the wafer W which is being rotated at high speed (edge discharge). The supply of the SPM to the peripheral portion on the surface of the wafer W is performed over a predetermined edge discharge time period (e.g., for 13 seconds). That is, in an edge discharge time period, the arm driving mechanism 33 is controlled so that the movement of the SPM nozzle 2 is stopped, and the movement of the position where the SPM is supplied is stopped at the peripheral portion on the surface of the wafer W. Consequently, the SPM is intensively supplied to the peripheral portion on the surface of the wafer W, so that a resist in a thick film shape formed at the peripheral portion on the surface is stripped from the wafer W or enters a state where it is easily stripped from the wafer W.

Thereafter, the arm driving mechanism 33 is controlled so that the SPM nozzle 2 is moved upward from the center on the surface, including a rotation center, of the wafer W. At this time, the SPM valve 42 remains opened. As the SPM nozzle 2 is moved, the position where the SPM is supplied on the surface of the wafer W is moved from an edge position E at the peripheral portion to a center position C at the center (in this case, it coincides with the rotation center of the wafer W) (center discharge).

After the position where the SPM is supplied is moved, the SPM is intensively supplied to the center on the surface of the wafer W, so that a resist formed at the center on the surface of the wafer W is stripped from the wafer W or enters a state where it is easily stripped from the wafer W. The SPM supplied to the center on the surface of the wafer W receives a large centrifugal force produced by the rotation at high speed (rotation at the first rotational speed) of the wafer W, and flows while being expanded at a relatively high flow rate from the supply position to the peripheral portion on the surface of the wafer W. Thus, the SPM quickly spreads over the entire area on the surface of the wafer W, so that the stripping of the resist formed at not only the center on the surface of the wafer W but also the peripheral portion on the surface of the wafer W further progresses.

When a predetermined time period (e.g., 27 seconds) has elapsed since the SPM nozzle 2 was moved upward from the center on the surface of the wafer W, the rotational driving mechanism 14 is controlled, so that the rotational speed of the wafer W is reduced from the first rotational speed to a second rotational speed (e.g., 10 rpm) lower than the first rotational speed in approximately 3 seconds. While the speed is being reduced, the SPM valve 42 remains opened, so that the SPM continues to be supplied from the SPM nozzle 2 to the center on the surface of the wafer W.

The supply of the SPM to the center on the surface of the wafer W is further continued until a predetermined time period (e.g., 7 seconds) has elapsed since the rotational speed of the wafer W was reduced to the second rotational speed. During the period, the SPM supplied to the center on the surface of the wafer W receives a very small centrifugal force produced by rotation at low speed (rotation at the second rotational speed) of the wafer W, and is gradually expanded from the supply position toward the peripheral portion on the surface of the wafer W, to form a liquid film by a mount of the SPM on the surface of the wafer W.

While the supply of the SPM is continued, the SPM spills from the peripheral edge on the surface of the wafer W by the supply of a new SPM. When a predetermined time period has elapsed since the rotational speed of the wafer W was reduced, and the SPM valve 42 is closed so that the discharge of the SPM from the SPM nozzle 2 is stopped, the SPM from the peripheral edge on the surface of the wafer W hardly flows down by surface tension of the SPM, so that a liquid film of the SPM which almost stands still is formed on the surface of the wafer W. A state where the liquid film of the SPM which stands still is formed (a paddle state) is maintained until a predetermined paddle time period (e.g., 30 to 120 seconds) has elapsed since the discharge of the SPM was stopped. Therefore, the resist which remains in an easily stripped state on the surface of the wafer W is completely stripped away from the surface of the wafer W.

As described in the foregoing, according to the present embodiment, after the SPM is intensively supplied to the peripheral portion on the surface of the wafer W in a state where the wafer W is being rotated at high speed, the position where the SPM is supplied is moved, so that the SPM is supplied to the center on the surface of the wafer W.

At the peripheral portion on the surface of the wafer W, the resist remains in a thick film state without being patterned. The SPM is intensively supplied to the peripheral portion on the surface of the wafer W, so that the resist formed at the peripheral portion on the surface of the wafer W is intensively subjected to processing using the SPM (resist stripping). The resist stripping liquid supplied to the center on the surface of the wafer W flows from the supply position to the peripheral portion on the surface of the wafer W. Therefore, the peripheral portion on the surface of the wafer W is also subjected to the processing using the SPM at this time. This allows the resist formed in a thick film state at the peripheral portion on the surface of the wafer W to be satisfactorily stripped. As a result, the resist can be completely stripped from the entire area on the surface of the wafer W.

Here, even if the SPM is supplied to the center on the surface of the wafer W, and is then supplied to the peripheral portion on the surface of the wafer W by moving the position where the SPM is supplied, the resist formed in a thick film state at the peripheral portion on the surface of the wafer W can be satisfactorily stripped. In the case, however, the SPM is not supplied to the center on the surface of the wafer W while being supplied to the peripheral portion on the surface. Therefore, the SPM adhering to the center on the surface of the wafer W is dried during that period, so that contamination of the wafer W (a drying trace of the SPM, generation of particles by deposition of a component of the SPM, etc.) by the drying of the SPM may occur.

On the other hand, in a case where the SPM is supplied to the peripheral portion on the surface of the wafer W prior to being supplied to the center on the surface, as in the present embodiment, the SPM can be prevented from being dried on the surface of the wafer W, so that the contamination of the wafer W by the drying of the SPM can be avoided. Moreover, in order to accumulate the SPM in the state of a substantially uniform liquid film on the surface of the wafer W, the SPM must be supplied to the center on the surface of the wafer W. Therefore, it is desirable that the SPM is supplied to the center on the surface of the wafer W after being supplied to the peripheral portion on the surface of the wafer W because the SPM nozzle 2 is not uselessly moved, thereby allowing a more efficient processing operation to be realized.

The SPM supplied to the center on the surface of the wafer W receives a large centrifugal force produced by the rotation at high speed of the wafer W, and flows while being expanded at a relatively high flow rate from the supply position to the peripheral portion on the surface of the wafer W. Therefore, the SPM quickly spreads over the entire area on the surface of the wafer W. Thus, a time period during which the resist stripping liquid is supplied to the surface of the wafer W can be shortened, and a processing time period can be shortened by the shortened time period.

Moreover, the SPM flows at a high flow rate on the surface of the wafer W while being supplied to the surface of the wafer W, so that the reacted SPM which contributes to the processing is quickly replaced with an unreacted SPM which does not contribute to the processing over the entire area on the surface of the wafer W. Therefore, the entire area on the surface of the wafer W can be always subjected to processing using a new unreacted SPM. Thus, the performance of stripping the resist on the surface of the wear W (the resist stripping performance) can be significantly improved.

Furthermore, the paddle state is maintained after the rotational speed of the wafer W is reduced to the second rotational speed, thereby allowing the resist and the SPM to be sufficiently reacted with each other over the entire area on the surface of the wafer W while minimizing the consumption of the resist stripping liquid. Even if the resist is a relatively tough resist (e.g., a resist used for high-concentration ion implantation), therefore, the resist can be completely stripped from the surface of the wafer W.

Moreover, the resist is stripped from the entire area on the surface of the wafer W prior to forming the liquid film of the SPM. Alternatively, even if the resist remains on the surface of the wafer W, the resist remaining on the surface of the wafer W enters a state where it is easily stripped from the wafer W. Even if a puddle time period is set short, therefore, the remaining resist can be completely stripped. Therefore, good resist stripping processing can be achieved in a shorter processing time period than that in the conventional resist stripping processing by setting the puddle time period short.

Although in the present embodiment, the wafer W is taken as an example of the substrate to be processed, not only the wafer W but also other types of substrates such as a glass substrate for a liquid crystal display device, a glass substrate for a plasma display panel, a glass substrate for a photomask, and a substrate for a magneto-optical disk may be processing objects.

Although the present invention has been described and illustrated in detail, it is completely understood that the same is by way of illustration and example only and is not to be taken by way of limitation, the spirit and scope of the present invention being limited only by the terms of the appended claims.

The present application corresponds to an application NO. 2004-74814 filed with the Japanese Patent Office on Mar. 16, 2004, the disclosure of which is hereinto incorporated by reference.

What is claimed is:

1. A resist stripping method for stripping a resist formed on a surface of a substrate using a resist stripping liquid produced by mixing a sulfuric acid and a hydrogen peroxide solution, comprising:

a substrate holding step performed by holding the substrate to be processed with its surface directed upward by a substrate holding mechanism;

a substrate rotating step performed by rotating the substrate held by the substrate holding mechanism around an axis crossing the surface of the substrate;

a resist stripping liquid supplying step performed by supplying the resist stripping liquid to the surface of the substrate and stripping the resist during the substrate rotating step;

a speed reducing step performed by reducing the rotational speed of the substrate from a first rotational speed to a second rotational speed lower than the first rotational speed during the resist stripping liquid supplying step; and after the speed reducing step, a puddling step performed by maintaining a liquid film formed by an amount of the resist stripping liquid by surface tension and without flowing on the surface of the substrate and thereby further stripping the resist;

further comprising a supply position moving step performed by moving the position where the resist stripping liquid is supplied on the surface of the substrate from a peripheral portion of the substrate to a center of the substrate during the resist stripping liquid supplying step; and wherein in the supply position moving step, the movement of the supply position is stopped at the peripheral portion on the surface of the substrate only for a predetermined time period from the beginning of supply of the resist stripping liquid, and then the supply position is moved from the peripheral portion to the center.

2. The resist stripping method according to claim 1, wherein the supply position moving step is carried out while the substrate is being rotated at the first rotational speed before the speed reducing step.

3. The resist stripping method according to claim 1, wherein the resist stripping liquid supplying step continues after the speed reducing step is completed.

4. The resist stripping method according to claim 1, wherein the first rotational speed is set to a rotational speed of not less than 1000 rpm.

* * * * *